(12) United States Patent
Song

(10) Patent No.: US 9,654,705 B2
(45) Date of Patent: May 16, 2017

(54) IMAGING DEVICE FOR CAPTURING OPTICAL IMAGES

(71) Applicant: Sony Corporation, Tokyo (JP)

(72) Inventor: Qi Song, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 106 days.

(21) Appl. No.: 13/909,406

(22) Filed: Jun. 4, 2013

(65) Prior Publication Data

US 2013/0329105 A1 Dec. 12, 2013

(30) Foreign Application Priority Data

Jun. 11, 2012 (JP) ................................. 2012-131679

(51) Int. Cl.
| | |
|---|---|
| H04N 5/225 | (2006.01) |
| H04N 5/335 | (2011.01) |
| H01L 27/146 | (2006.01) |
| H04N 5/235 | (2006.01) |
| H04N 5/238 | (2006.01) |

(52) U.S. Cl.
CPC ....... *H04N 5/335* (2013.01); *H01L 27/14621* (2013.01); *H01L 27/14625* (2013.01); *H01L 27/14627* (2013.01); *H04N 5/2254* (2013.01); *H04N 5/238* (2013.01); *H04N 5/2355* (2013.01)

(58) Field of Classification Search
CPC .................... H01L 27/14625; H01L 27/14627
USPC ................................... 348/340; 359/265–275
See application file for complete search history.

(56) References Cited

U.S. PATENT DOCUMENTS

| | | | |
|---|---|---|---|
| 5,047,847 A * | 9/1991 | Toda et al. ...................... 348/68 |
| 6,388,709 B1 * | 5/2002 | Kobayashi ........ H01L 27/14621 |
| | | | 348/270 |
| 6,861,014 B2 * | 3/2005 | Fitzmaurice et al. ........ 252/583 |
| 6,952,233 B2 * | 10/2005 | Nagano ................ H04N 5/2254 |
| | | | 348/224.1 |
| 7,295,241 B2 * | 11/2007 | Sugimoto et al. ............ 348/340 |
| 8,508,830 B1 * | 8/2013 | Wang ............................. 359/267 |
| 8,614,848 B2 * | 12/2013 | Ueda et al. .................... 359/275 |
| 8,618,588 B2 * | 12/2013 | Ackerson et al. ............. 257/292 |
| 8,847,135 B2 * | 9/2014 | Izuha et al. ................ 250/208.1 |
| 8,964,107 B2 * | 2/2015 | Miyazaki ................ G02F 1/155 |
| | | | 348/370 |
| 9,177,984 B2 * | 11/2015 | Izuha ................ H01L 27/14621 |
| 2005/0259986 A1 * | 11/2005 | Kaneiwa et al. ............. 396/506 |
| 2012/0249829 A1 * | 10/2012 | Izuha ................ H01L 27/14621 |
| | | | 348/229.1 |
| 2013/0088637 A1 * | 4/2013 | Duparre ........................ 348/360 |

* cited by examiner

*Primary Examiner* — Ngoc-Yen Vu
(74) *Attorney, Agent, or Firm* — Chip Law Group

(57) ABSTRACT

An imaging device includes an image capturing unit configured to capture an optical image of a corresponding one of pixels included in a screen, and the image capturing unit of part of the pixels in the screen includes an adjustment unit which contains an electric field responsive material and is configured to adjust a transmittance of light by the electric field responsive material, and a light-receiving unit configured to receive the light for which the transmittance has been adjusted by the adjustment unit.

18 Claims, 5 Drawing Sheets

T: TRANSMITTANCE ADJUSTABLE

FIG. 4
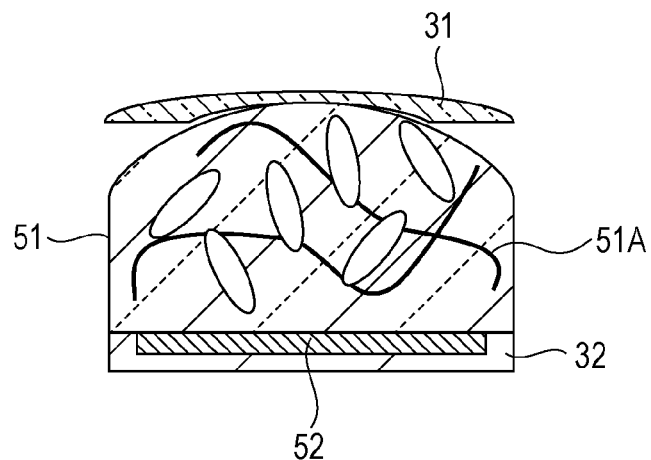
FIG. 5
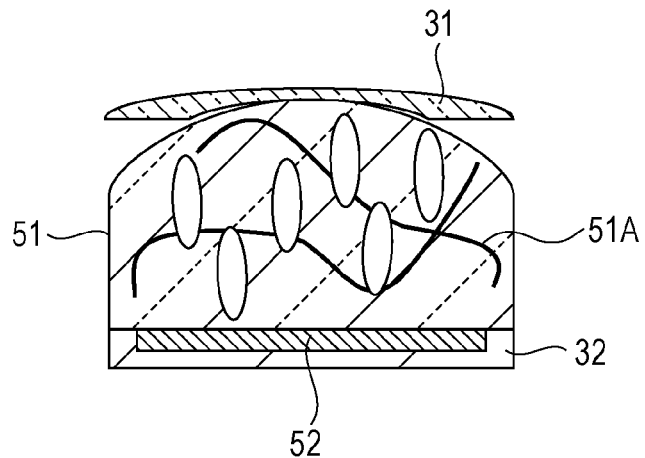
FIG. 6
| R | G | R | G |
| --- | --- | --- | --- |
| Bk | B | Bk | B |
| R | G | R | W |
| W | B | G | B |

T: TRANSMITTANCE ADJUSTABLE

T: TRANSMITTANCE ADJUSTABLE

IMAGING DEVICE FOR CAPTURING OPTICAL IMAGES

BACKGROUND

The present technology relates to an imaging device, and particularly to an imaging device which achieves reduced size when sensitivity of image capturing and dynamic range are improved by using an electric field responsive material.

In recent years, improvement of sensitivity of image capturing and dynamic range has been demanded along with miniaturization of pixels of image sensors.

Thus, an imaging device has been devised in which liquid crystal panel capable of partially changing the transmittance of visible light is arranged in the preceding stage of a CCD (Charge Coupled Device) image sensor, and feedback control of the concentration of the liquid crystal of the liquid crystal panel is performed according to an image signal outputted from the CCD image sensor (for example, see Japanese Unexamined Patent Application Publication No. 2003-9007). In such an imaging device, even when a difference between light and dark of a subject image is large, no highlight occurs, and an image signal with a high dynamic range may be generated.

In addition, an imaging device has been devised which expands the dynamic range by forming a photochromic film in the preceding stage of a photo diode, the photochromic film having a transmittance which varies according to the amount of incident light (for example, see Japanese Unexamined Patent Application Publication No. 2011-216701).

SUMMARY

The imaging device described in Japanese Unexamined Patent Application Publication No. 2003-9007, however, has a configuration in which a liquid crystal panel is provided in addition to a CCD image sensor, thereby increasing the size of the imaging device. Thus, it is desirable to reduce the size of the imaging device when sensitivity of image capturing and the dynamic range are improved by using an electric field responsive material such as a liquid crystal.

The present technology has been devised in view of the above situation, and achieves reduced size of the imaging device when sensitivity of image capturing and the dynamic range are improved by using an electric field responsive material.

An imaging device according to an embodiment of the present technology includes an image capturing unit configured to capture an optical image of a corresponding one of pixels included in a screen, and the image capturing unit of part of the pixels in the screen includes an adjustment unit which contains an electric field responsive material and is configured to adjust a transmittance of light by the electric field responsive material, and a light-receiving unit configured to receive the light for which the transmittance has been adjusted by the adjustment unit.

BRIEF DESCRIPTION OF THE DRAWINGS

FIG. 4 illustrates the behavior of an electric field responsive material when a voltage is not applied;

FIG. 5 illustrates the behavior of an electric field responsive material when a voltage is applied;

FIG. 6 illustrates another example of pixel array of the image sensor;

DETAILED DESCRIPTION OF EMBODIMENTS

[Embodiment]
[Configuration Example of Embodiment of Imaging Device]

Figure 1:
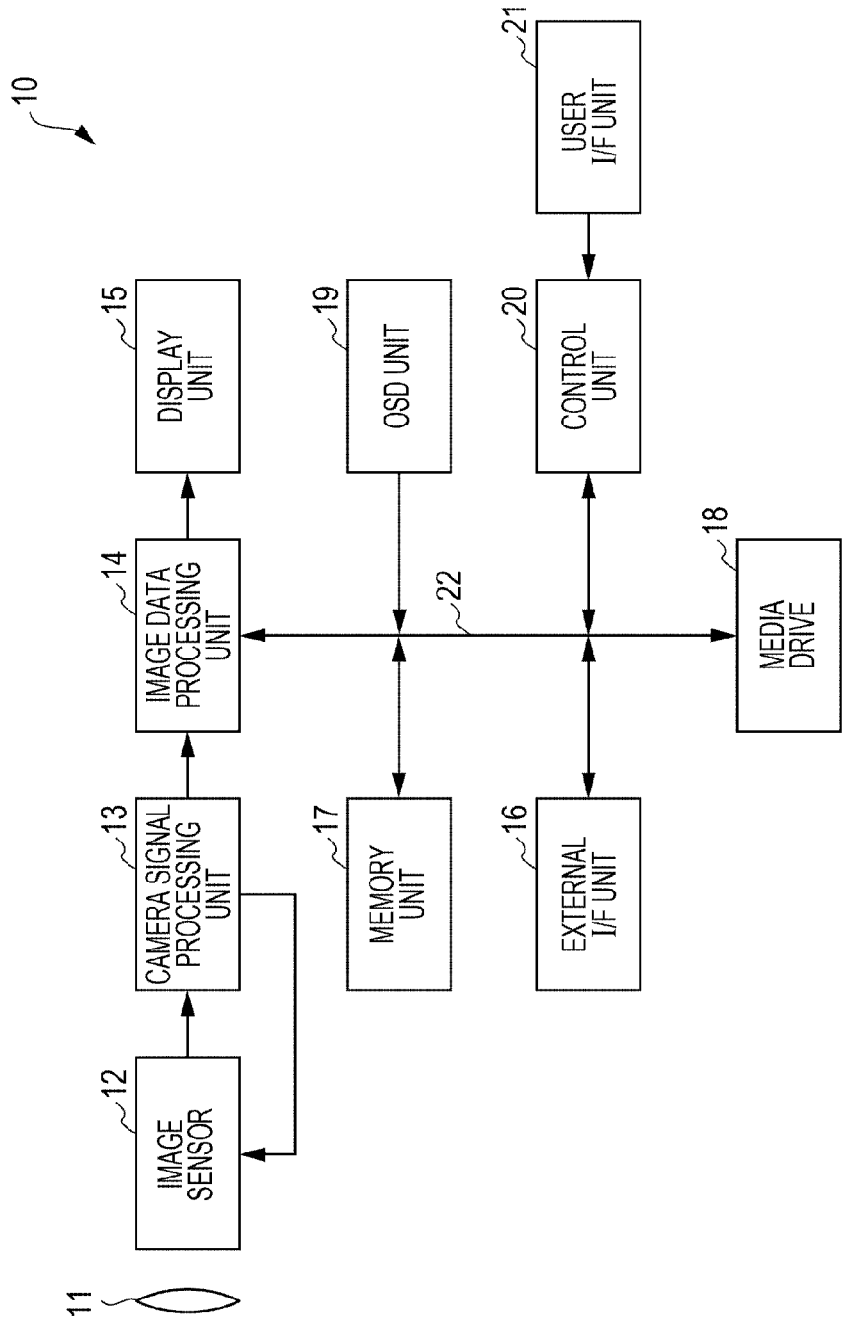
FIG. 1 is a block diagram illustrating a configuration example of an imaging device according to an embodiment of the present technology.

FIG. 1 is a block diagram illustrating a configuration example of an imaging device according to an embodiment of the present technology.

An imaging device 10 includes an optical block 11, an image sensor 12, a camera signal processing unit 13, an image data processing unit 14, a display unit 15, an external interface (I/F) unit 16, a memory unit 17, a media drive 18, an OSD unit 19, and a control unit 20. The control unit 20 is connected to a user interface (I/F) unit 21.

In addition, the image data processing unit 14, the external interface unit 16, the memory unit 17, the media drive 18, the OSD unit 19, and the control unit 20 are connected to each other via a bus 22. The imaging device 10 captures an image of a subject, and displays the captured image on the display unit 15 or records the image data in the media drive 18.

Specifically, the optical block 11 of the imaging device 10 includes a focal lens and an aperture mechanism. The optical block 11 forms an optical image of a subject on a light-receiving surface of the image sensor 12.

The image sensor 12 includes a CCD image sensor, a surface irradiation type CMOS (Complementary Metal-Oxide Semiconductor) image sensor, and a rear surface irradiation type CMOS image sensor. The image sensor 12 allows light from the optical block 11 to pass through with a predetermined transmittance and receives the light by the control of the camera signal processing unit 13, the light corresponding to part of the pixels which constitute a screen. The image sensor 12 directly receives light corresponding to the remaining pixels from the optical block 11. The image sensor 12 performs photoelectric conversion of an optical image obtained from the received light to generate an electrical signal. The image sensor 12 supplies the generated electrical signal to the camera signal processing unit 13.

The camera signal processing unit 13 serves as a determination unit or a control unit, and determines the current transmittance to be a maximum transmittance or a minimum transmittance according to the electrical signal supplied from the image sensor 12 before an image capturing command is issued by a user, i.e., during a monitoring mode. The camera signal processing unit 13 then controls the image sensor 12 so as to allow light to pass through and receive the light according to the determined transmittance, the light corresponding to part of the pixels which constitute the screen. That is to say, the camera signal processing unit 13 performs feedback control of the transmittance at the time of image capturing according to the electrical signal in the monitoring mode.

Specifically, the camera signal processing unit 13 determines whether or not the amount of light on the whole screen is greater than a predetermined threshold value according to, for example, the electrical signal in the monitoring mode. When the amount of light on the whole screen is greater than the predetermined threshold value, the camera signal processing unit 13 determines the current transmittance to be a minimum transmittance. The camera signal processing unit 13 determines whether or not the amount of light on the whole screen is less than or equal to the predetermined threshold value according to, for example, the electrical signal in the monitoring mode. When the amount of light on the whole screen is less than or equal to the predetermined threshold value, the camera signal processing unit 13 determines the current transmittance to be a maximum transmittance. In this manner, the camera signal processing unit 13 controls the transmittance according to the amount of light on the whole screen, thereby improving the sensitivity of image capturing and the dynamic range.

The camera signal processing unit 13 performs various camera signal processing such as knee correction, gamma correction, or color correction on the electrical signal supplied from the image sensor 12. The camera signal processing unit 13 supplies image data to the image data processing unit 14, the image data being obtained as a result of camera signal processing.

The image data processing unit 14 performs coding of the image data supplied from the camera signal processing unit 13. The image data processing unit 14 supplies coded data to the external interface unit 16 and the media drive 18, the coded data being generated by performing the coding. The image data processing unit 14 performs decoding of the coded data which is supplied from the external interface unit 16 or the media drive 18.

The image data processing unit 14 supplies image data to the display unit 15, the image data being generated by performing the decoding. The image data processing unit 14 supplies image data to the display unit 15, or superimposes display data obtained from the OSD unit 19 on the image data and supplies the superimposed data to the display unit 15, the image data being supplied from the camera signal processing unit 13.

The OSD unit 19 generates display data such as an icon or a menu screen including a symbol, a character, or a figure, and outputs the display data to the image data processing unit 14.

The external interface unit 16 includes, for example, a USB (Universal Serial Bus) input/output terminal, and is made to be connected to a printer when an image is printed. The external interface unit 16 is made to be connected to a drive as necessary, a removable medium such as a magnetic disk or an optical disk is inserted in the drive as appropriate, and a computer program read from the drive is installed to the memory unit 17 as necessary.

The external interface unit 16 has a network interface which is connected to a predetermined network such as a LAN (Local Area Network) or the Internet. The control unit 20 may read coded data from the media drive 18 according to a command from the user interface unit 21, for example, and may supply the coded data from the external interface unit 16 to other devices connected via the network. Conversely, the control unit 20 may obtain coded data and image data via the external interface unit 16 to supply the data to the image data processing unit 14, the coded data and image data being supplied from other devices via the network.

A readable/writable removable medium such as a magnetic disk, a magneto-optical disk, an optical disk, or a semiconductor memory may be used as a recording medium driven by the media drive 18. The recording medium may be of any type of removable medium, and thus may be a tape device, a disk, or a memory card. Needless to say, the recording medium may be a non-contact IC (Integrated Circuit) card.

The recording medium may be integrated with the media drive 18, and may serve as a non-transportable recording medium such as a built-in hard disk drive or a SSD (Solid State Drive), for example.

The control unit 20 is formed by using a CPU (Central Processing Unit) or the like. The memory unit 17 stores programs to be executed by the control unit 20 and various types of data necessary for the control unit 20 to perform processing. Any of the programs, which are stored in the memory unit 17, may be read and executed by the control unit 20 at a predetermined timing such as activation timing of the imaging device 10. The control unit 20 executes a program, thereby controlling corresponding unit so as to operate the imaging device 10 according to an operation of a user.

[Example of Pixel Array of Image Sensor]

Figure 2:
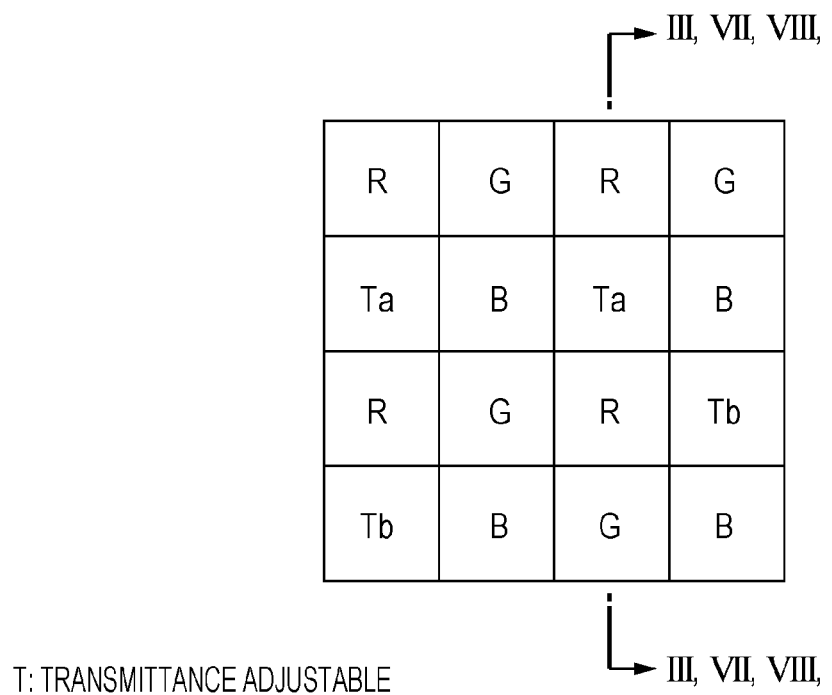
FIG. 2 illustrates an example of pixel array of an image sensor.

FIG. 2 illustrates an example of pixel array of the image sensor 12 in FIG. 1.

Hereinafter, the image sensor 12 is assumed to have 4×4 pixels for convenience of description.

Here, (i, j) pixel denotes the pixel that is on the ith column (i is an integer greater than or equal to 1) from the left and on the jth row (j is an integer greater than or equal to 1) from the top. In the example of FIG. 2, (1, 1) pixel is a red (R) pixel. Furthermore, (2, 1) pixel is a green (G) pixel, (1, 2) pixel is a transmittance adjustable pixel a (details will be described below), and (2, 2) pixel is a blue (B) pixel. Similarly to the 2×2 pixels formed in this manner at the upper left, 2×2 pixels at the upper right are formed.

The 2×2 pixels at the lower left include (1, 3) pixel as an R pixel, (2, 3) pixel as a G pixel, (1, 4) pixel as a transmittance adjustable pixel b, and (2, 4) pixel as a B pixel. Similarly to the 2×2 pixels at the lower left, 2×2 pixels at the lower right are formed.

It is to be noted that the transmittance adjustable pixel is a pixel in which the transmittance of light is adjusted by an electric field responsive material. Different voltages are applied to the transmittance adjustable pixel a and the transmittance adjustable pixel b, respectively. Hereinafter, the transmittance adjustable pixel a and the transmittance adjustable pixel b are collectively referred to as a transmittance adjustable pixel unless the two transmittance adjustable pixels are intended to be distinguished from each other.

As described above, the pixel array of the image sensor 12 is obtained by replacing part of G pixels in a Bayer array with transmittance adjustable pixels. The pixels to be replaced with transmittance adjustable pixels may be R pixels or B pixels instead of G pixels. However, when part of G pixels in a Bayer array are replaced with transmittance adjustable pixels, the resolution of the Bayer array may be maintained.

[Cross-sectional View of First Configuration Example of Image Sensor]

Figure 3:
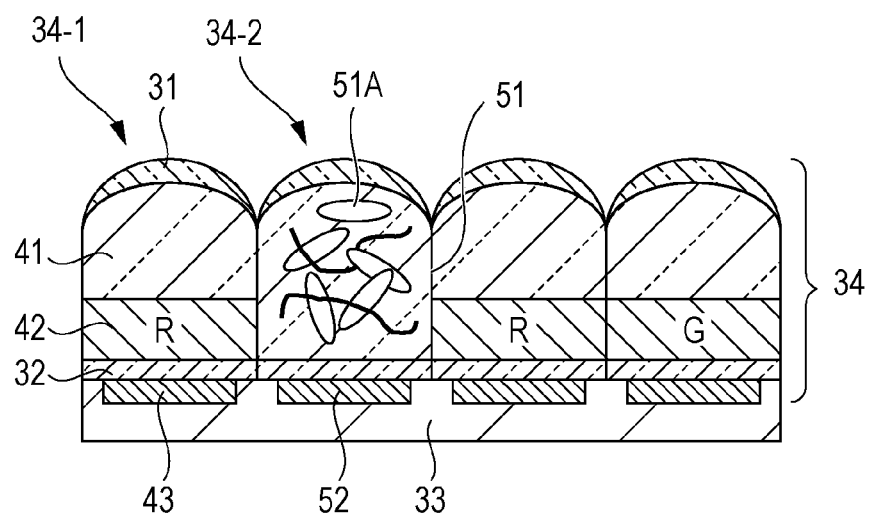
FIG. 3 is a cross-sectional view taken along line III-III of a first configuration example of the image sensor.

FIG. 3 is a cross-sectional view taken along line III-III of a first configuration example of the image sensor 12 having the pixel array illustrated in FIG. 2.

As illustrated in FIG. 3, the image sensor 12 includes a transparent electrode 31, a transparent electrode 32, a substrate 33 which are provided for each screen, and an image capturing unit 34 which is provided for each pixel.

The transparent electrode 31 and the transparent electrode 32 are formed, for example with ITO (Indium Tin Oxide). The transparent electrode 31 and the transparent electrode 32 are provided with an insulating material per pixel, and the transparent electrodes corresponding to adjacent pixels are insulated from each other. The image capturing unit 34 captures an optical image corresponding to each pixel.

Specifically, an image capturing unit 34-1 corresponding to R pixel as (3, 1) pixel includes an on-chip lens 41 and a color filter 42 which are successively disposed between the transparent electrode 31 and the transparent electrodes 32, and a photo diode 43 which is disposed below the transparent electrode 32 and arranged on the substrate 33.

The light from a subject enters the on-chip lens 41 through the transparent electrode 31. The on-chip lens 41 concentrates the incident light so as to form an image on the photo diode 43. The light concentrated by the on-chip lens 41 enters the color filter 42 which allows only red component of the incident light to emit.

The light emitted from the color filter 42 passes through the transparent electrode 32 to form an image on the light-receiving surface of the photo diode 43. The photo diode 43 performs photoelectric conversion of the optical image formed on the light-receiving surface, and supplies a resultant electrical signal to the camera signal processing unit 13 in FIG. 1.

So far, the image capturing unit 34-1 corresponding to R pixel as (3, 1) pixel has been described, and an image capturing unit corresponding to another R pixel is formed in a similar manner. That is to say, for example, the image capturing unit corresponding to R pixel as (3, 3) pixel is formed in a similar manner to the image capturing unit 34-1 corresponding to R pixel as (3, 1) pixel.

Any image capturing unit corresponding to G pixel or B pixel is also formed in a similar manner to the image capturing unit corresponding to R pixel except that the respective color filters emit green light and blue light.

On the other hand, as illustrated in FIG. 3, an image capturing unit 34-2 corresponding to the transmittance adjustable pixel as (3, 2) pixel includes an on-chip lens 51 disposed between the transparent electrode 31 and the transparent electrode 32, and a photo diode 52 arranged on the substrate 33.

The light from a subject enters the on-chip lens 51 through the transparent electrode 31. The on-chip lens 51 is an organic layer including an electric field responsive material 51A and serves as an adjustment unit. The electric field responsive material 51A, which may be used, includes, for example, a functional liquid crystal polymer material, an electrochromic material such as polymer network liquid crystal (liquid crystal polymer), PDLC (Polymer Dispersed Liquid Crystal), or liquid crystal gel, or a solid material such as a graphene film.

A voltage according to a transmittance is applied to the transparent electrode 31 and the transparent electrode 32 by the control of the camera signal processing unit 13 in FIG. 1, and the transparent electrode 31 and the transparent electrode 32 apply the voltage to the on-chip lens 51. The electric field responsive material 51A adjusts the transmittance of incident light according to the voltage.

Consequently, the light emitted from the on-chip lens 51 has a transmittance adjusted with respect to the transmittance of the incident light to the on-chip lens 51, and is concentrated to form an image on the photo diode 52. The light emitted from the on-chip lens 51 passes through the transparent electrode 32 to form an image on the light-receiving surface of the photo diode 52.

The photo diode 52 serves as a light-receiving unit, i.e., receives the light emitted from the on-chip lens 51 on the light-receiving surface, and performs photoelectric conversion of an optical image formed on the light-receiving surface. The photo diode 52 supplies a resultant electrical signal to the camera signal processing unit 13.

So far, the image capturing unit 34-2 corresponding to the transmittance adjustable pixel as (3, 2) pixel has been described, and an image capturing unit corresponding to another transmittance adjustable pixel is formed in a similar manner.

[Description of Behavior of Electric Field Responsive Material]

FIG. 4 illustrates the behavior of the electric field responsive material 51A when a voltage is not applied by the transparent electrode 31 and the transparent electrode 32; and FIG. 5 illustrates the behavior of the electric field responsive material 51A when a predetermined voltage is applied by the transparent electrode 31 and the transparent electrode 32.

As illustrated in FIG. 4, when a voltage is not applied by the transparent electrode 31 and the transparent electrode 32, the orientation of the electric field responsive material 51A is random, and thus the transmittance of the incident light has a minimum value. As a result, the light received by the photo diode 52 corresponds to black image data.

On the other hand, as illustrated in FIG. 5, when a predetermined voltage is applied by the transparent electrode 31 and the transparent electrode 32, the orientation of the electric field responsive material 51A is aligned with the direction of the electric field, and thus the transmittance of the incident light has a maximum value. As a result, the light received by the photo diode 52 corresponds to white image data.

Therefore, when a voltage is not applied by the transparent electrode 31 and the transparent electrode 32 of the transmittance adjustable pixel a in FIG. 2, and a voltage is applied by the transparent electrode 31 and the transparent electrode 32 of the transmittance adjustable pixel b, the pixel array of the image sensor 12 is as illustrated in FIG. 6. That is to say, the transmittance adjustable pixel a changes to a black (Bk) pixel, and the transmittance adjustable pixel b changes to a white (W) pixel.

[Cross-sectional View of Second Configuration Example of Image Sensor]

Figure 7:
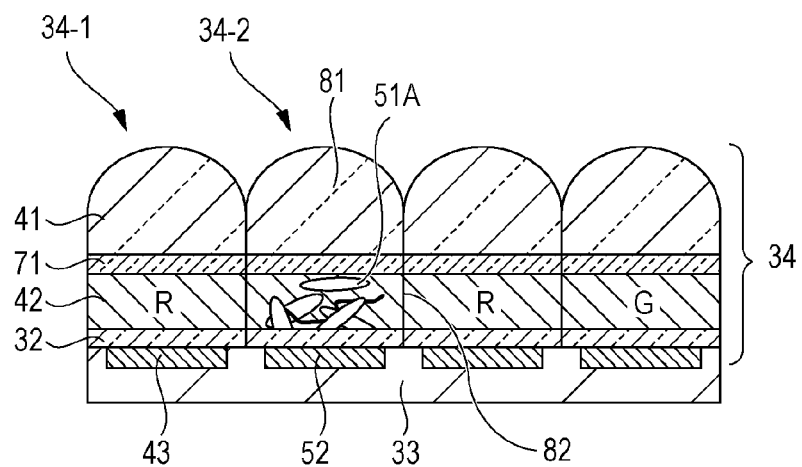
FIG. 7 is a cross-sectional view taken along line VII-VII of a second configuration example of the image sensor.

FIG. 7 is a cross-sectional view taken along line VII-VII of a second configuration example of the image sensor 12 having the pixel array illustrated in FIG. 2.

The components in the configuration illustrated in FIG. 7 which are the same as those in the configuration in FIG. 3 are labeled with the same reference symbols, and redundant description will be omitted as appropriate.

The configuration of the image sensor 12 of FIG. 7 differs from the configuration of FIG. 3 in that a transparent electrode 71 is provided instead of the transparent electrode 31, and the image capturing unit 34-2 is different. In the image sensor 12 of FIG. 7, the electric field responsive material 51A is included not in the on-chip lens 51, but in a filter 82 provided as a color filter.

Specifically, the transparent electrode 71 of the image sensor 12 is disposed not on the on-chip lens 41, but on the color filter 42.

The configuration of the image capturing unit 34-2 differs from the configuration of FIG. 3 in that an on-chip lens 81 is provided instead of the on-chip lens 51, and the filter 82 is additionally provided.

The on-chip lens 81 of the image capturing unit 34-2 is formed in a similar manner to the on-chip lens 41. The on-chip lens 81 concentrates the light from a subject so as to form an image on the photo diode 52, and allows the light to enter the filter 82 through the transparent electrode 71. The filter 82 is an organic layer including the electric field responsive material 51A and serves as an adjustment unit.

A voltage according to a transmittance is applied to the transparent electrode 71 and the transparent electrode 32 by the control of the camera signal processing unit 13 in FIG. 1, and the transparent electrode 71 and the transparent electrode 32 apply the voltage to the filter 82. The electric field responsive material 51A adjusts the transmittance of incident light according to the voltage.

Consequently, the light emitted from the filter 82 has undergone the adjustment of the transmittances of all colors of light which have entered the filter 82. The light emitted from the filter 82 passes through the transparent electrode 32 to form an image on the light-receiving surface of the photo diode 52.

As illustrated in FIG. 7, when the filter 82 including the electric field responsive material 51A is used as a color filter, the color filter 42 serves as an insulating material (pixel separation unit) in the case where transmittance adjustable pixels are not adjacent to each other. Thus, in such a case, the transparent electrode 71 and the transparent electrode 32 may not be provided with an insulating material for each pixel.

[Cross-sectional View of Third Configuration Example of Image Sensor]

Figure 8:
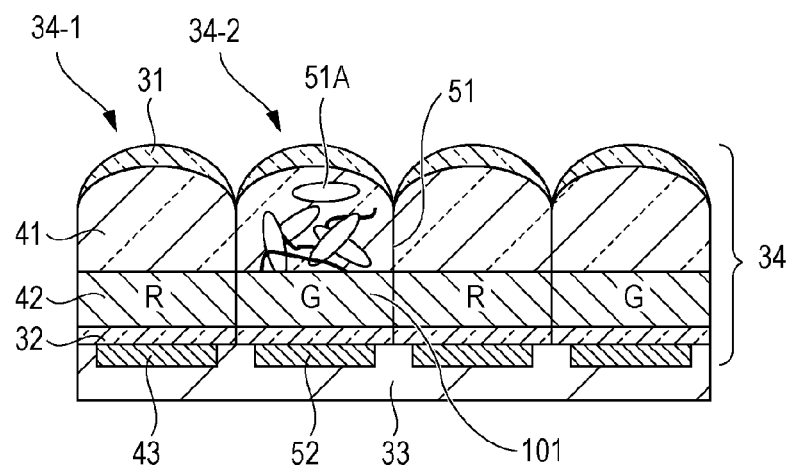
FIG. 8 is a cross-sectional view taken along line VIII-VIII of a third configuration example of the image sensor.

FIG. 8 is a cross-sectional view taken along line VIII-VIII of a third configuration example of the image sensor 12 having the pixel array illustrated in FIG. 2.

The components in the configuration illustrated in FIG. 8 which are the same as those in the configuration in FIG. 3 are labeled with the same reference symbols. Redundant description will be omitted as appropriate.

The configuration of the image sensor 12 in FIG. 8 differs from the configuration of FIG. 3 in that the image capturing unit 34-2 has a different structure. In the image sensor 12 in FIG. 8, the image capturing unit 34-2 is also provided with a color filter 101.

Specifically, the configuration of the image capturing unit 34-2 in FIG. 8 differs from the configuration of FIG. 3 in that a color filter 101 is additionally provided.

Thus, light with a transmittance adjusted by the on-chip lens 51 enters the color filter 101 so as to form an image on the photo diode 52. The color filter 101 emits to the photo diode 52 only a predetermined color component of the incident light through the transparent electrode 32.

As described above, the image capturing unit 34-2 in FIG. 8 receives only a predetermined color light out of the light corresponding to the transmittance adjustable pixels, and thus the camera signal processing unit 13 may obtain an electrical signal of the predetermined color light as the electrical signal corresponding to the transmittance adjustable pixels. As a result, color reproduction of image data may be improved.

[Configuration Example of Transparent Electrode]

Figure 9:
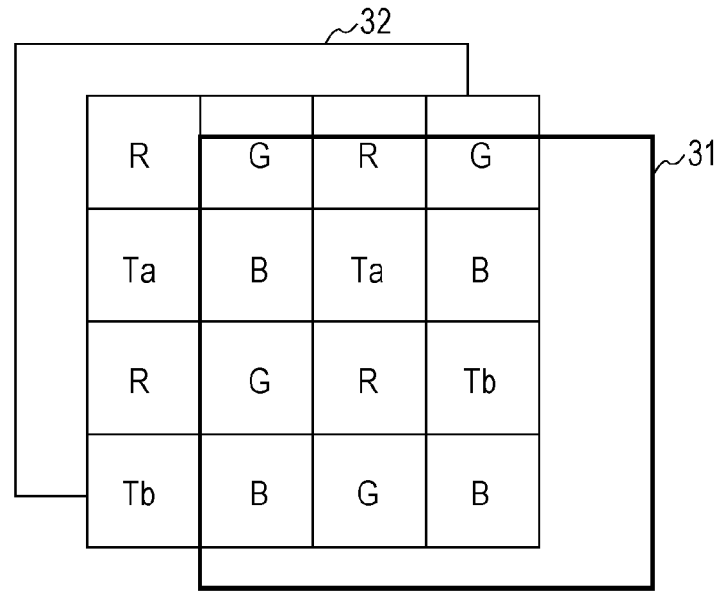
FIG. 9 illustrates a configuration example of a transparent electrode.

FIG. 9 illustrates a configuration example of the transparent electrode 31 (71) and the transparent electrode 32.

As illustrated in FIG. 9, the transparent electrode 31 (71) and the transparent electrode 32 are provided for each screen. Thus, the transmittances of the transmittance adjustable pixel a and the transmittance adjustable pixel b are adjusted for each screen. That is to say, both the transmittance adjustable pixel a and the transmittance adjustable pixel b provided in the screen may change to black pixels, white pixels, or one pixel may change to a black pixel and the other pixel may change to a white pixel.

It is to be noted that the transparent electrode 31 (71) may be provided not for each screen but for each column or row.

[Another Configuration Example of Transparent Electrode]

Figure 10:
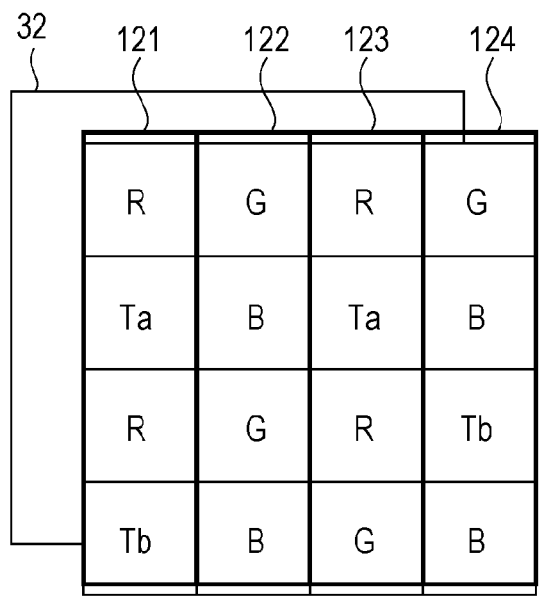
FIG. 10 illustrates another configuration example of the transparent electrode.

FIG. 10 illustrates another configuration example of transparent electrode when the transparent electrode 31 (71) is provided for each column.

In FIG. 10, transparent electrodes 121 to 124 for respective columns are provided instead of the transparent electrodes 31 (71), and the transparent electrodes 121 to 124 apply a voltage to the electric field responsive material 51A of each transmittance adjustable pixel which is arranged on one of corresponding columns. Thus, the transmittances of the transmittance adjustable pixel a and the transmittance adjustable pixel b are adjusted for each column.

Consequently, when the image sensor 12 is a CCD image sensor, the camera signal processing unit 13 may identify the area of smear light source for each column or pixel according to, for example, an electrical signal in the monitoring mode, and may determine a minimum value as the transmittance of the transmittance adjustable pixels a and/or the transmittance adjustable pixels b in each column in the vicinity of the area. As a result, only the transmittance adjustable pixel a and/or transmittance adjustable pixel b in each of the columns corresponding to the area of smear light source may be changed to black pixels, and thus smear may be significantly reduced.

Optionally, the camera signal processing unit 13 may determine the transmittance of at least one of the transmittance adjustable pixel a and the transmittance adjustable pixel b to be a minimum value according to an electrical signal in the monitoring mode so as to change any pixel having the minimum value to black pixel, the pixels a and b being located on a column having the amount of light greater than a predetermined threshold value. The camera signal processing unit 13 may determine the transmittance of at least one of the transmittance adjustable pixel a and the transmittance adjustable pixel b to be a maximum value according to an electrical signal in the monitoring mode so as to change any pixel having the maximum value to white pixel, the pixels a and b being located on a column having the amount of light less than or equal to the predetermined threshold value. Consequently, the sensitivity of image capturing and the dynamic range may be improved.

As described above, in contrast to the case in FIG. 9, the provision of the transparent electrodes 121 to 124 for the respective columns allows the ratio of the number of white pixels to the number of black pixels in the screen to be flexibly changed.

In the imaging device 10, for the image capturing unit 34-2 in the image capturing unit 34 of a transmittance adjustable pixel, the electric field responsive material 51A is included in the on-chip lens 51 and the filter 82. Therefore, a liquid crystal panel other than the image sensor 12 may not be provided, and thus the size of the imaging device 10 may be reduced and miniaturized.

In addition, the imaging device 10 may determine a transmittance according to an electrical signal outputted from the image sensor 12, thereby enabling to perform feedback control of the transmittance. On the other hand, in the imaging device described in Japanese Unexamined Patent Application Publication No. 2011-216701, the transmittance of light is controlled by a photochromic film having a transmittance which varies according to the amount of incident light, and thus feedback control of the transmittance may not be performed.

The imaging device 10 controls a transmittance by a voltage to be applied to the electric field responsive material 51A, and thus a transmittance may be easily controlled in contrast to the case where a transmittance is controlled by the concentration of liquid crystal as in the imaging device described in Japanese Unexamined Patent Application Publication No. 2003-9007.

In addition, the imaging device 10 uses a solid material as the electric field responsive material 51A, thereby preventing reduced reliability due to leakage of liquid crystal. Furthermore, a polarizing plate or a molecular orientation film is not used, and thus the number of manufacturing processes may be reduced in contrast to the case where low-molecular liquid crystal cells are used as the electric field responsive material as in the imaging device described in Japanese Unexamined Patent Application Publication No. 2003-9007. As a result, the difficulty of the process of the image sensor 12 may be reduced.

The imaging device 10 controls a transmittance by the electric field responsive material 51A, and thus is less susceptible to the influence of outdoor air temperature in contrast to the case where a transmittance is controlled by photochromic reactions which are often reversible as in the imaging device described in Japanese Unexamined Patent Application Publication No. 2011-216701.

In the present embodiment, the camera signal processing unit 13 determines a transmittance according to an electrical signal in the monitoring mode. However, the control unit 20 may determine a transmittance according to image capturing conditions or a request which is inputted by a user's operation of the user interface unit 21.

For example, when a night scene shooting mode is selected as a shooting mode by a user's operation of the user interface unit 21, the control unit 20 may apply a predetermined voltage to each transmittance adjustable pixel to change the pixel to a white pixel. Alternatively, when a daytime scene shooting mode is selected as a shooting mode by a user's operation of the user interface unit 21, the control unit 20 may not apply the predetermined voltage to each transmittance adjustable pixel to change the pixel to a black pixel.

A ferroelectric material may also be used as the electric field responsive material 51A in order to improve the response speed.

The electric field responsive material 51A may be contained in a component other than the above-described on-chip lens or filter when the electric field responsive material 51A forms an organic layer on the incident light path from a subject, the organic layer being included in the image sensor 12.

The transmittance determined by the camera signal processing unit 13 is not limited to a maximum transmittance or a minimum transmittance, and may be any transmittance in a range from the minimum transmittance or more and the maximum transmittance or less.

The embodiment according to the present technology is not limited to the above-described embodiment, and may be modified in various manners in a range without departing from the spirit of the present technology.

The present technology may also adopt the following configurations.

(1) An imaging device including an image capturing unit configured to capture an optical image of a corresponding one of pixels included in a screen, and the image capturing unit of part of the pixels in the screen includes an adjustment unit which contains an electric field responsive material and is configured to adjust a transmittance of light by the electric field responsive material, and a light-receiving unit configured to receive the light for which the transmittance has been adjusted by the adjustment unit.

(2) The imaging device according to the above statement (1), further including a determination unit configured to determine the transmittance according to the optical image captured by the image capturing unit.

(3) The imaging device according to the above statement (2), in which the determination unit determines the transmittance at the time of image capturing according to the optical image captured by the image capturing unit before the image capturing.

(4) The imaging device according to any one of the above statements (1) to (3), in which the adjustment unit adjusts the transmittance to a maximum transmittance or a minimum transmittance.

(5) The imaging device according to any one of the above statements (1) to (4), in which the image capturing unit of the part of the pixels further includes: an electrode unit configured to apply a voltage to the adjustment unit; and a control unit configured to control the transmittance by controlling the voltage to be applied to the electrode unit.

(6) The imaging device according to the above statement (5), in which the electrode unit applies a voltage per column basis to any adjustment unit of the pixels arranged on each of columns of the screen.

(7) The imaging device according to any one of the above statements (1) to (6), in which the adjustment unit is an on-chip lens.

(8) The imaging device according to the above statement (7), in which the image capturing unit of the part of the pixels further includes a color filter.

(9) The imaging device according to any one of the above statements (1) to (6), in which the adjustment unit is a filter.

(10) The imaging device according to any one of the above statements (1) to (9), in which the electric field responsive material is a liquid crystal polymer material.

(11) The imaging device according to any one of the above statements (1) to (9), in which the electric field responsive material is an electrochromic material.

(12) The imaging device according to any one of the above statements (1) to (9), in which the electric field responsive material is a graphene film.

(13) The imaging device according to any one of the above statements (1) to (12), in which the image capturing unit is a CMOS (Complementary Metal-Oxide Semiconductor) image sensor.

(14) The imaging device according to any one of the above statements (1) to (12), in which the image capturing unit is a CCD (Charge Coupled Device) image sensor.

The present disclosure contains subject matter related to that disclosed in Japanese Priority Patent Application JP 2012-131679 filed in the Japan Patent Office on Jun. 11, 2012, the entire contents of which are hereby incorporated by reference.

What is claimed is:
1. An imaging device comprising:
an image capturing unit configured to capture an optical image of a corresponding one of pixels included in a screen; and
a determination unit configured to determine a transmittance of light based on the captured optical image, wherein the image capturing unit of a part of the pixels in the screen includes:
an adjustment unit comprising an on-chip lens which contains an electric field responsive material and is configured to adjust the transmittance of light based on an orientation of the electric field responsive material and the determined transmittance,
wherein the orientation of the electric field responsive material is aligned with the direction of an electric field formed in the on-chip lens in an event a voltage is applied to the adjustment unit, and
a light-receiving unit configured to receive the light for which the transmittance has been adjusted by the adjustment unit.

2. The imaging device according to claim 1, wherein the determination unit is configured to determine the transmittance at a time of image capture according to the optical image captured by the image capturing unit before the image capture.

3. The imaging device according to claim 1, wherein the adjustment unit is configured to adjust the transmittance to a maximum transmittance or a minimum transmittance.

4. The imaging device according to claim 1, wherein the image capturing unit of the part of the pixels further includes:
an electrode unit configured to apply the voltage to the adjustment unit; and
a control unit configured to control the voltage to be applied to the electrode unit to control the transmittance.

5. The imaging device according to claim 4, wherein the electrode unit is configured to apply the voltage per column basis to the adjustment unit of the pixels arranged on each of columns of the screen.

6. The imaging device according to claim 1, wherein the image capturing unit of the part of the pixels further includes a color filter.

7. The imaging device according to claim 1, wherein the adjustment unit is a filter.

8. The imaging device according to claim 1, wherein the electric field responsive material is a liquid crystal polymer material.

9. The imaging device according to claim 1, wherein the electric field responsive material is an electrochromic material.

10. The imaging device according to claim 1, wherein the electric field responsive material is a graphene film.

11. The imaging device according to claim 1, wherein the image capturing unit is a Complementary Metal-Oxide Semiconductor (CMOS) image sensor.

12. The imaging device according to claim 1, wherein the image capturing unit is a Charge Coupled Device (CCD) image sensor.

13. The imaging device according to claim 1, wherein the adjustment unit is configured to adjust the transmittance to a maximum transmittance or a minimum transmittance, wherein in an event an amount of light on the screen is less than or equal to a threshold value, the transmittance is determined to be the maximum transmittance.

14. The imaging device according to claim 13, wherein in an event the amount of light on the screen is greater than or equal to the threshold value, the transmittance is determined to be the minimum transmittance.

15. The imaging device according to claim 1, wherein the orientation of the electric field responsive material is random and the adjusted transmittance of the light has a minimum value, in an event the voltage is not applied.

16. The imaging device according to claim 15, wherein the light receiving unit is configured to receive the light which corresponds to black image data, in an event the adjusted transmittance of the light has the minimum value.

17. The imaging device according to claim 1, wherein the adjusted transmittance of the light has a maximum value, in an event the orientation of the electric field responsive material is aligned with the direction of the electric field.

18. The imaging device according to claim 17, wherein the light receiving unit is configured to receive the light which corresponds to white image data, in an event the adjusted transmittance of the light has the maximum value.

* * * * *